United States Patent [19]

Murotani

[11] Patent Number: 4,733,373
[45] Date of Patent: Mar. 22, 1988

[54] DYNAMIC MEMORY WITH IMPROVED ARRANGEMENT FOR PRECHARGING BIT LINES

[75] Inventor: Tatsunori Murotani, Tokyo, Japan
[73] Assignee: NEC Corporation, Tokyo, Japan
[21] Appl. No.: 824,030
[22] Filed: Jan. 30, 1986
[30] Foreign Application Priority Data
Jan. 30, 1985 [JP] Japan .................................. 60-15877
[51] Int. Cl.⁴ ............................................... G11C 7/00
[52] U.S. Cl. ..................................... 365/203; 365/205
[58] Field of Search .............. 365/203, 204, 205, 149, 365/207, 208, 189, 190, 202

[56] References Cited

U.S. PATENT DOCUMENTS

| | | | |
|---|---|---|---|
| 4,601,017 | 7/1986 | Mochizuki et al. ................... | 365/189 |
| 4,608,670 | 8/1986 | Duvvury et al. .................... | 365/205 |
| 4,627,033 | 12/1986 | Hyslop et al. ........................ | 365/205 |
| 4,638,463 | 1/1987 | Rockett, Jr. .......................... | 365/205 |

Primary Examiner—Joseph A. Popek
Attorney, Agent, or Firm—Sughrue, Mion, Zinn, Macpeak, and Seas

[57] ABSTRACT

A dynamic memory which can accurately precharge a pair of bit lines to a potential equal to half the power supply voltage and which has improved detection characteristics is disclosed. The dynamic memory is of the type in which a precharge potential of a pair of bit lines is generated by short-circuiting the pair of bit lines after the pair of bit lines are discriminated into the power supply voltage and the reference voltage (ground). A compensation capacitor is provided for the pair of bit lines. The compensation capacitor is charged to the power supply voltage and the charged compensation capacitor is operatively connected to the pair of bit lines when they are short-circuited to thereby raise the potential on the bit lines to half the power supply voltage.

12 Claims, 6 Drawing Figures

DYNAMIC MEMORY WITH IMPROVED ARRANGEMENT FOR PRECHARGING BIT LINES

BACKGROUND OF THE INVENTION

The present invention relates to a dynamic memory composed of semiconductor elements, and more particularly to a circuit for precharging the bit lines of the dynamic memory.

Dynamic memories employing one-transistor type memory cells have been predominately utilized as large capacity memories. The one-transistor type memory cell is comprised of a storage capacitor and a transfer gate MOS transistor connected between the storage capacitor and a bit line and having a gate coupled to a word line. In order to achieve high sensitivity detection of a stored signal in a selected memory cell, a differential type sense amplifier is provided for each pair of bit lines. Prior to access operation, each pair of bit lines are precharged to a power voltage. Then, one of a pair of bit lines is subjected to a change in potential due to the content of a selected memory cell while a charge stored in a dummy cell (storing a charge intermediate that corresponding to logic "1" and "0" states of the memory cell) is applied to the other bit line of the bit line pair. Then a sense amplifier is enabled to amplify the difference in potential between the bit lines of the bit line pair such that one of the bit lines is discharged from the power voltage to a ground potential while the other bit line maintains the power voltage. Recently, an improved technique for precharging bit lines was proposed. According to this technique, after the potentials on the pair of bit lines are discriminated into the power voltage $V_{cc}$ and ground, respectively, the pair of bit lines are short-circuited. Thus, the potential of the pair of bit lines is set to approximately half the power voltage i.e. $\frac{1}{2} V_{cc}$ due to charge division by the pair of bit lines. This technique is advantageous in that the power consumption of the memory can be significantly reduced, and it is possible to eliminate the dummy cell which has been necessary to operate the sense amplifier. However, in the bit line pair, the potential of the higher potential side bit line is only half the power voltage or less when amplification by a differential sense amplifier is completed. Therefore, in order to re-write the power voltage to the selected memory cell storing a "1" for refreshing the "1" value of the selected memory cell and to raise the higher potential side bit line to the power voltage for subsequent short-circuiting as explained above, the higher potential side bit line is raised in potential to the power voltage $V_{cc}$ by an active pull-up circuit employing a boosting capacitor through which the power voltage is applied to the higher potential side bit line. However, when a pair of bit lines are short-circuited, the boosting capacitor is also connected to the pair of bit lines, particularly to the higher potential side bit line. Also in this instance, certain regions of transistors of the sense amplifier are connected to the short-circuited bit lines to impose a capacitance thereon. Accordingly, the resultant potential remaining on the pair of bit lines does not reach exactly half the power voltage but takes a value less than the latter. As a result, the voltage set at the pair of bit lines shifts from the center value between the "1" and "0" values as stored in respective memory cells. Thus, the differential voltage between the precharged potential of a bit line and a potential stored in a selected memory cell is different according to whether the selected memory cell stores a "1" or "0". This means that the operational margin for a sense amplifier varies according to the content stored in the selected memory cell, resulting in unstable operation.

SUMMARY OF THE INVENTION

It is an object of the present invention to provide a dynamic memory provided with an improved arrangement for accurately precharging a pair of bit lines to half the power voltage.

The dynamic memory according to the present invention is of the type having a pair of bit lines, an amplifier coupled to the pair of bit lines for operatively amplifying potentials on the pair of bit lines to two different voltages, the amplifier including an internal capacitance which is connected to the pair of bit lines when they are short-circuited, and a short-circuiting means for short-circuiting the pair of bit lines after the potentials of the pair of bit lines are amplified. The invention also features a compensation capacitor. The compensation capacitor is charged before the bit lines are short-circuited and then is connected to the short-circuited bit lines. The charge accumulated in the compensation capacitor is used to adjust the potential on the short-circuited bit lines to a desired value.

According to one aspect of the present invention, there is provided a dynamic memory of the type having a pair of bit lines, a pair of cross-coupled MOSTs having gates and drains cross-connected at a pair of sense nodes which are connected to the pair of bit lines and commonly connected sources at a common node, the pair of MOSTs serving as a flip-flop, a circuit for short-circuiting the pair of bit lines to thereby set the pair of bit lines at a voltage intermediate that of a power voltage and a reference voltage, and a pair of pull-up circuits provided for the pair of bit lines for raising the higher potential side bit line to the power voltage through a boost capacitor, and featuring a compensation capacitor and a charge circuit for charging one end of the compensation capacitor to the power voltage before the pair of bit lines are short-circuited, the one end of the compensation capacitor being connected to the pair of bit lines when the pair of bit lines are short-circuited.

According to the present invention, charge stored in the compensation capacitor compensates a potential drop due to the capacitance of the boost capacitor and the capacitance of the common node and raises the potential on the short-circuited bit lines to half the power voltage effectively. The capacitance of the compensation capacitor is selected to be equal to the sum of the capacitances of the boost capacitor and the common node.

According to the present invention, the pair of bit lines are accurately precharged to half the power voltage, the sense of a signal stored in a selected memory cell can be performed with high-sensitivity and increased stability.

DETAILED DESCRIPTION OF THE DRAWINGS

DETAILED DESCRIPTION OF THE INVENTION

Figure 1:
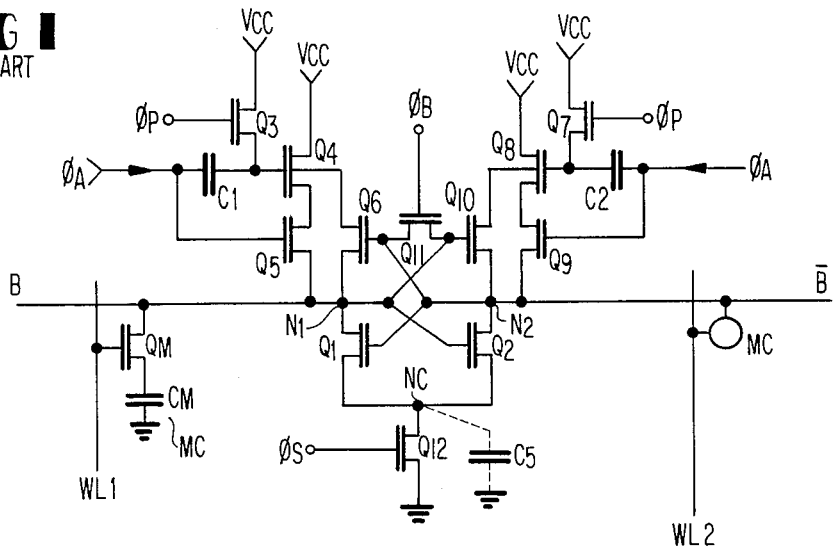
FIG. 1 is a schematic circuit diagram showing a major part of a dynamic memory according to a prior art.

FIG. 1 shows a major part of a dynamic memory according to the prior art. MOS field effect transistors (MOSTs) $Q_1$ and $Q_2$ having gates and drains cross-coupled at nodes $N_1$ and $N_2$ and sources commonly connected to a common node $N_c$ and a discharge MOST $Q_{12}$ form a known flip-flop type sense amplifier. A pair of bit lines B and $\overline{B}$ are connected to the nodes $N_1$ and $N_2$, respectively. A plurality of word lines $WL_1$, $WL_2$ or the like intersect the bit lines. Memory cells MC each comprised of a transfer MOST $Q_M$ and a storage capacitor $C_M$ are connected to the bit lines and word lines in a known way. MOSTs $Q_3$, $Q_4$, $Q_5$ and $Q_6$ and a boost capacitor $C_1$ form an active pull-up circuit for the bit line B while MOSTs $Q_7$, $Q_8$, $Q_9$ and $Q_{10}$ and a boost capacitor $C_2$ form another active pull-up circuit for the bit line $\overline{B}$. A MOST $Q_{11}$ connected between the nodes $N_1$ and $N_2$ short-circuits between the pair of bit lines B and $\overline{B}$ so as to precharge them with a voltage intermediate that of the power supply voltage $V_{cc}$ and ground potential (GND), after the potential difference between the pair of bit lines is amplified and discriminated into $V_{cc}$ and GND.

Figure 2:
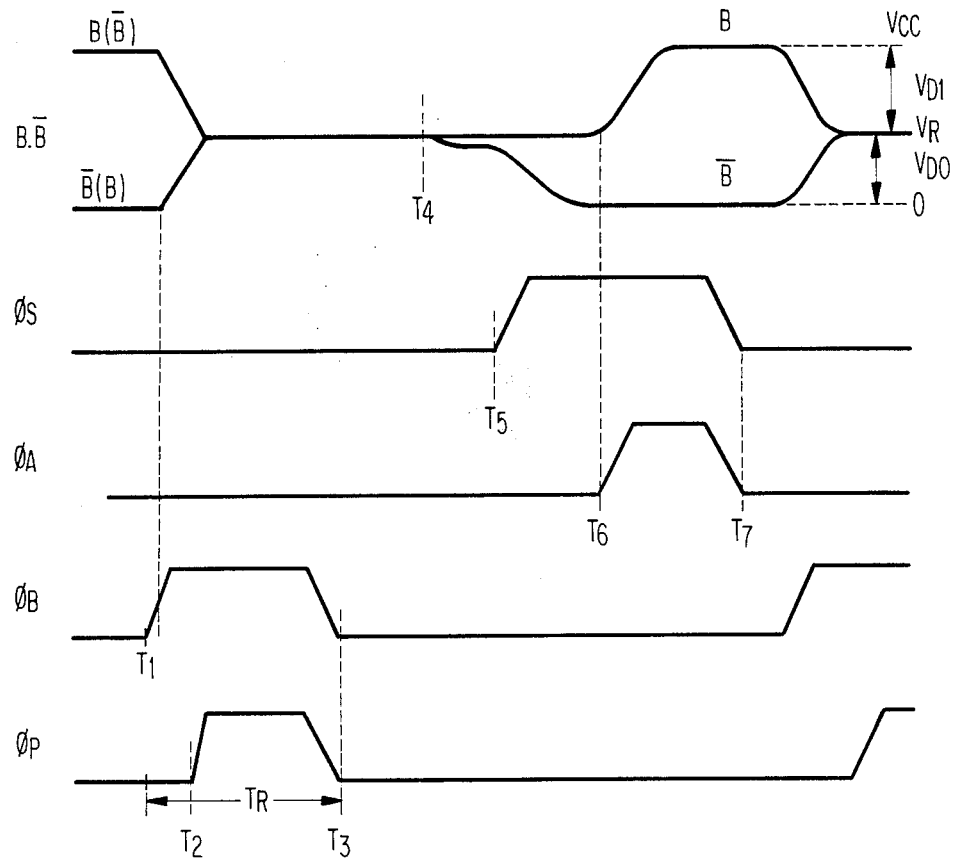
FIG. 2 is a timing chart showing the operation of the circuit of FIG. 1.

Referring to FIG. 2, the operation of the circuit of FIG. 1 will be described.

A pulse $\phi_B$ changes from a low (GND) level to a high level ($V_{cc}$) so that MOST $Q_{11}$ is rendered conductive at $T_1$. Accompanied by this, the bit lines B and $\overline{B}$ which have been at $V_{cc}$ and GND respectively change to the same intermediate voltage $V_R$ as a reference for operating the sense amplifier. In parallel with this change, a pulse $\phi_P$ is raised to $V_{cc}$ at a time $T_2$. Accordingly, output ends of the boost capacitors $C_1$ and $C_2$ are charged to $V_{cc}$. In this instance, gates and sources of MOSTs $Q_6$ and $Q_{10}$ are biased to $V_R$ and hence MOSTs $Q_6$ and $Q_{10}$ are kept non-conducting to ensure the precharge of the output ends of the capacitors $C_1$ and $C_2$. The pulses $\phi_B$ and $\phi_P$ change to a low level at a time $T_3$, to complete a reset precharge period $T_R$. Then, at a time $T_4$ one of the word lines, e.g. $WL_2$ is selected and the bit line $\overline{B}$ is lowered in potential slightly due to the "0" level stored in a selected memory cell with the bit line B remaining at $V_R$. Then, a pulse $\phi_S$ is raised at a time $T_5$ to render MOST $Q_{12}$ conductive. Thus, the lower potential side bit line $\overline{B}$ is discharged to GND without materially discharging the higher potential side bit line B by the flip-flop composed of MOSTs $Q_1$ and $Q_2$.

In this instance, MOST $Q_{10}$ becomes conductive due to the discharged level of the bit line $\overline{B}$ and therefore the capacitor $C_2$ for the lower potential side bit $\overline{B}$ is discharged, while charge of the capacitor $C_1$ is maintained. Subsequently, a pulse $\phi_A$ rises at a time $T_6$ so that a gate potential of MOST $Q_4$ is raised above $V_{cc}$ through the capacitor and MOST $Q_6$ assumes a conductive state. Therefore, the power supply voltage $V_{cc}$ is applied to the higher potential side bit line B through MOSTs $Q_4$ and $Q_5$ to thereby pull-up of the bit line B to $V_{cc}$ in potential. While the capacitor $C_2$ has been discharged, MOST $Q_{10}$ has been conductive so that the gate potential cannot be raised by $\phi_A$. Therefore, MOST $Q_8$ remains non-conductive so that the power supply voltage $V_{cc}$ is not applied to the lower potential side bit line $\overline{B}$. Thus, the potential different between the bit lines B and $\overline{B}$ is extended to $V_{cc}$. Then, the pulses $\phi_A$ and $\phi_S$ change to GND potential at a time $T_7$ to complete an access cycle.

In the following, the practical value of $V_R$ obtained in the circuit of FIG. 1 will be discussed.

The pair of bit lines B and $\overline{B}$ are designed to have the same capacitance "$C_B$". After completion of pull-up, the pair of bit lines B and $\overline{B}$ would seem to assume the potential $V_R$ of $\frac{1}{2} V_{cc}$ due to charge division expressed as:

$$V_R = \frac{V_{cc} \times C_B + 0 \times C_B}{2 C_B} = \frac{1}{2} V_{cc}$$

However, this assumption is not correct in practice because of the following reason. As is clear from FIG. 1, when a pair of bit lines B and $\overline{B}$ are short-circuited, the node C and the boost capacitor $C_2$ are also connected to the short-circuited bit lines B and $\overline{B}$. Therefore, the electric charge of the bit line B ($V_{cc}$) is divided by not only the bit lines B and $\overline{B}$ but also by the capacitor $C_1$ and the capacitance of the node $N_c$. Therefore, representing the capacitance of the capacitor $C_1$ ($C_2$) as "$C_A$" and the capacitance of the node $N_c$ as "$C_S$", a practical value of the voltage $V_R$ is determined by the following equation (1):

$$V_R = \frac{V_{cc} \times C_B + 0 \times C_B}{2 C_B + C_A + C_S} V_{cc} < \frac{1}{2} V_{cc} \quad (1)$$

As a result, it should be understood that the practical value of $V_R$ is lower than the half the power voltage.

In a practical dynamic memory, values of $C_B$, $C_A$ and $C_S$ are 0.5 pF, 0.05 pF and 0.1 pF, respectively. Therefore, the value of $V_R$ becomes about 0.43 $V_{cc}$ which is over 10% lower than $\frac{1}{2} V_{cc}$. As is well known, it is desirable to select the value of $V_R$ at the center value ($\frac{1}{2} V_{cc}$) of the two potentials $V_{cc}$ and GND corresponding to "1" and "0" information stored in the memory cell. In the case where the value of $V_R$ is lower than $\frac{1}{2} V_{cc}$, the potential difference $V_{D1}$ between $V_R$ and the potential ($V_{cc}$) of a "1" storing memory cell becomes large while the potential difference $V_{D0}$ between $V_R$ and the potential (GND) of a "0" storing memory cell becomes small, as shown in FIG. 2. This means that the operating margin of the sense amplifier is changed according to the content of the selected memory cell, resulting in low operation stability.

Figure 3:
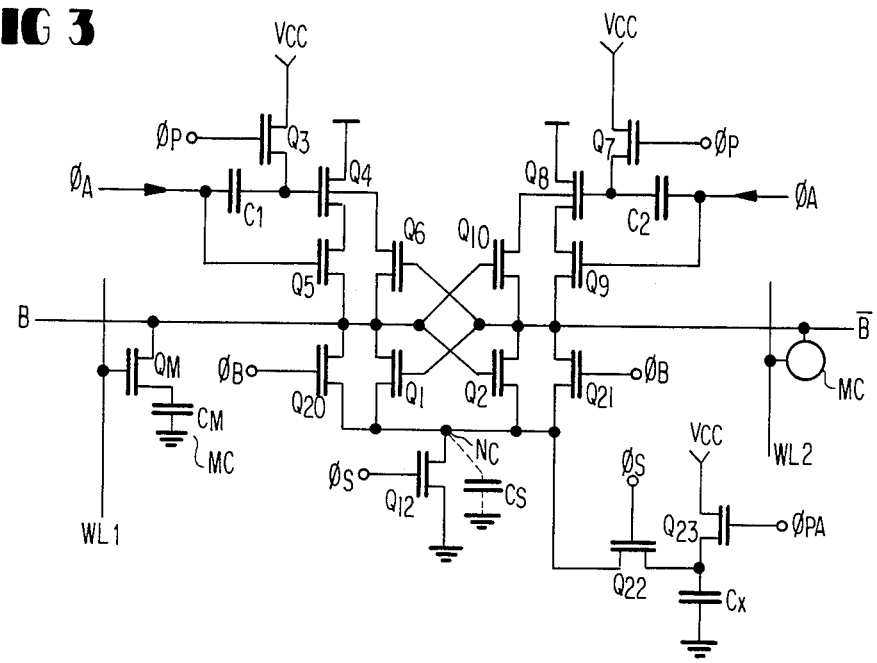
FIG. 3 is a schematic circuit diagram showing a major part of a dynamic memory according to a first embodiment of the invention.

Referring to FIG. 3, a dynamic memory according to a first embodiment of the invention will be explained.

In FIG. 3, portions corresponding to those in FIG. 1 are designated by the same reference characters.

According to this embodiment, in place of MOST $Q_{11}$ in FIG. 1, a MOST $Q_{20}$ connected between the bit line B and the common node $N_C$ and a MOST $Q_{21}$ connected between the bit line $\overline{B}$ and the node $N_C$ are provided for short-circuiting the bit lines B, $\overline{B}$ and the node $N_C$. A compensation capacitor $C_X$ is also provided according to the invention. A MOST $Q_{23}$ is provided for charging an output end of the capacitor $C_X$ to $V_{cc}$ in response to a pulse $\phi_{P4}$ and a MOST $Q_{22}$ operatively connects the output end of the capacitor $C_X$ to the node $N_C$ in response to the pulse $\phi_B$. According to this arrangement, the bit lines B, $\overline{B}$, the node $N_C$, the capacitor $C_1$ or $C_2$ and the capacitor $C_X$ are short-circuited in response to the pulse $\phi_0$ for generating $V_R$ on the bit lines B and $\overline{B}$, after the capacitor $C_X$ is charged to $V_{cc}$. Therefore, the resultant value of $V_R$ on the bit lines B and $\overline{B}$ is denoted by the following equation (2):

$$V_R = \frac{C_B + C_X}{2 C_B + C_A + C_S + C_X} V_{cc} \quad (2)$$

Then, if the following relation (3) is fulfilled, $$C_X \approx C_A + C_S \quad (3)$$

the value of $V_R$ becomes approximately $\frac{1}{2} V_{cc}$. Therefore, the capacitance of the capacitor $C_X$ is selected to have a value corresponding to the sum of the capacitance of the capacitor $C_1$ ($C_2$) and the capacitance of the node $N_C$.

Figure 4:
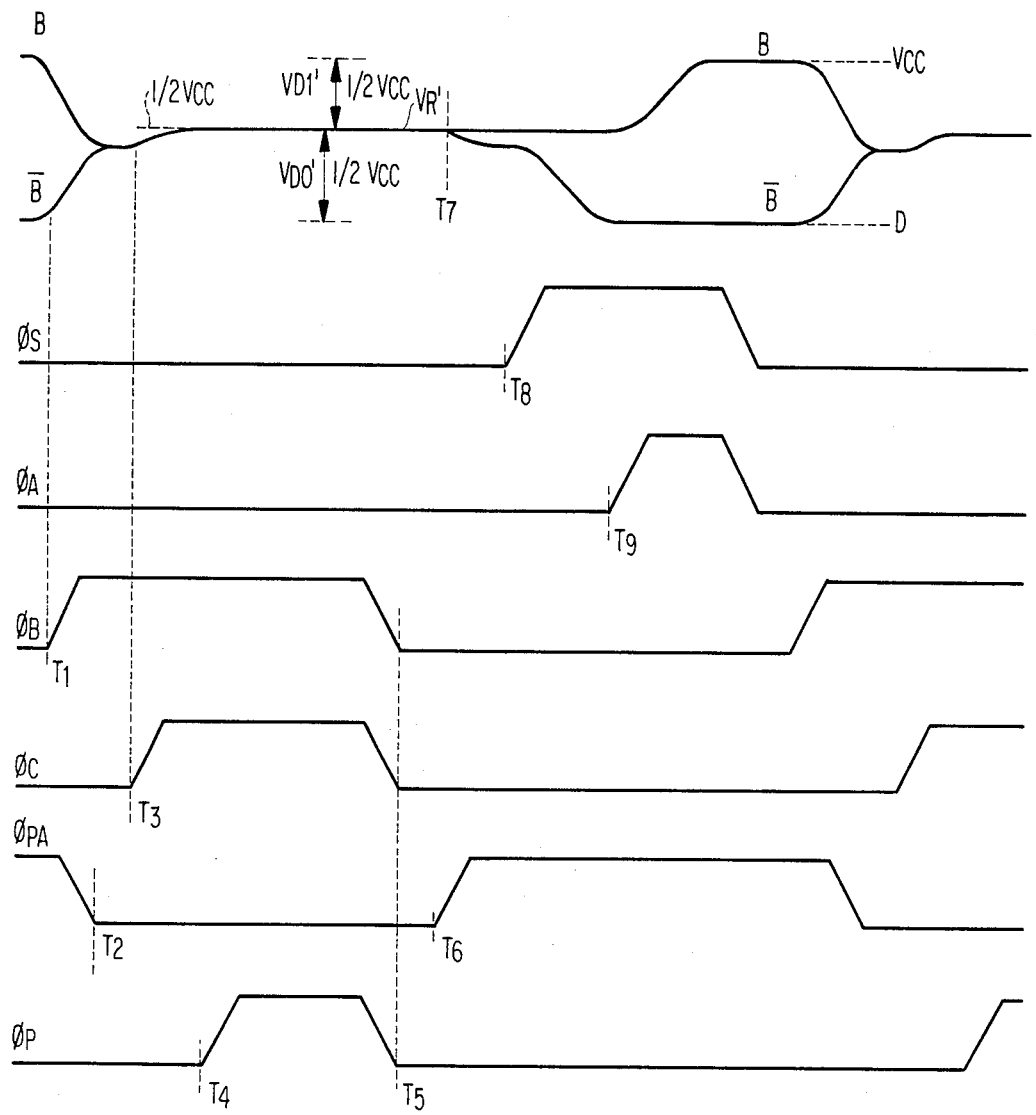
FIG. 4 is a timing chart showing the operation of the circuit of FIG. 3.

Referring to FIG. 4, the operation of the circuit of FIG. 3 will be described. Prior to a time $T_2$, the capacitor $C_X$ is charged to $V_{cc}$ through MOST $Q_{23}$ in response to $\phi_{P4}$, while the pulse $\phi_B$ is raised to $V_{cc}$ at a time $T_1$ so that the pair of bit lines B and $\overline{B}$, the node $N_C$ and the capacitor $C_2$ are short-circuited by MOSTs $Q_{20}$ and $Q_{21}$ so that the potential on the bit lines B and $\overline{B}$ assumes a potential which is lower than $\frac{1}{2} V_{cc}$ similarly to the case of FIG. 1. Then, MOST $Q_{22}$ becomes conductive in response to the rise of $\phi_C$ to connect the output end of the capacitor $C_X$ to the short-circuited bit lines B and $\overline{B}$. Accordingly, as explained by equations (2) and (3), the potential on the bit lines B and $\overline{B}$ shifts to $\frac{1}{2} V_{cc}$ ($V_R'$), achieving a precharge of the bit lines B and $\overline{B}$. At time $t_4$, the capacitors $C_1$ and $C_2$ are precharged to $V_{cc}$ in response to $\phi_P$, similarly to the circuit of FIG. 1. Then, the content of the selected memory cell is applied to the bit line $\overline{B}$ at a time $T_7$ so that the bit line $\overline{B}$ is reduced slightly in potential due to the "0" content of the selected memory cell. Then, the sense amplifier and the active pull-up circuits are sequentially enabled by $\phi_S$ and $\phi_A$ at a time $T_8$ and a time $T_9$, respectively in the same manner as in FIG. 1 to achieve an access operation. According to this invention, prior to the access operation, the bit lines B and $\overline{B}$ are accurately precharged to $\frac{1}{2} V_{cc}$, and therefore the voltage difference $V_{D1}'$ between the precharge voltage $V_R'$ and the potential of a "1" storing memory cell and the voltage difference $V_{D0}'$ between $V_R'$ and the potential of a "0" storing memory cell are made equal to each other. Thus, a high-sensitive and stable amplifying operation is obtained. In a 256 k-bit dynamic memory, a value of $C_S$ and the capacitance $C_A$ of the capacitors $C_1$, $C_2$ are 0.1 pF and 0.05 pF, respectively, and the value of the capacitance of the capacitor $C_X$ is selected to be 0.15 ($C_X = C_A + C_S = 0.05 + 0.1$) pF, in this case.

Figure 5:
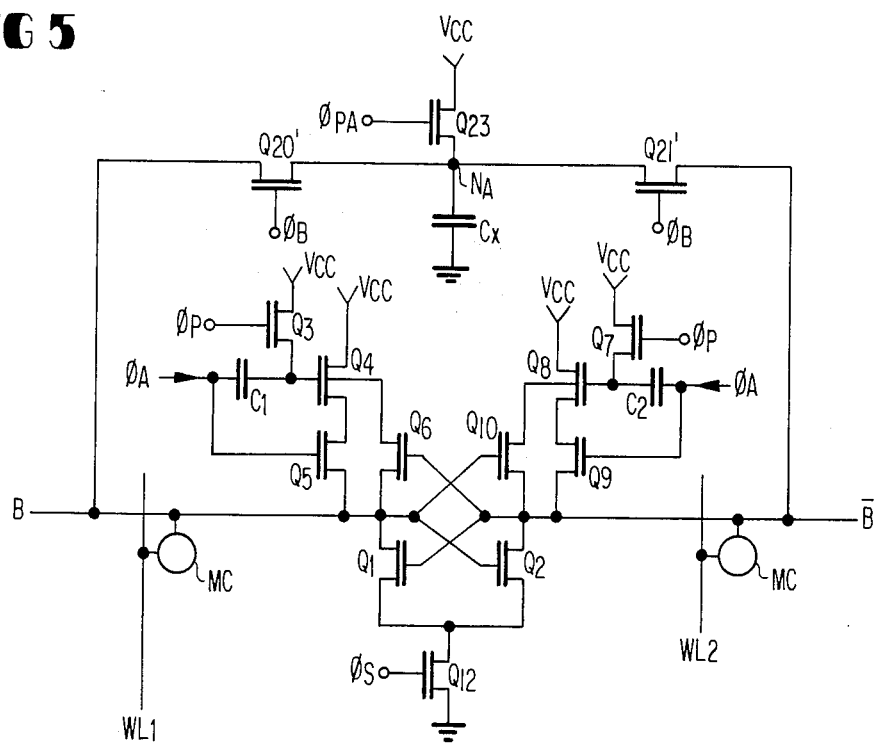
FIG. 5 is a schematic circuit diagram showing a dynamic memory according to a second embodiment of the present invention.

FIG. 5 shows a second embodiment of the present invention.

This embodiment is obtained by directly connecting the output end of the capacitor $C_X$ to the pair of bit lines B and $\overline{B}$ by MOST $Q_{20}'$ and $Q_{21}$ in place of MOSTs $Q_{20}$ to $Q_{22}$ in FIG. 3. According to this embodiment, MOST $Q_{22}$ and the pulse $\phi_C$ are obviated. As far as the capacitance of the capacitor $C_X$ is determined according to equation (3), this embodiment provides the same effect as described above. Timing relationships of the respective pulses in this circuit are substantially the same as those in FIG. 3.

Figure 6:
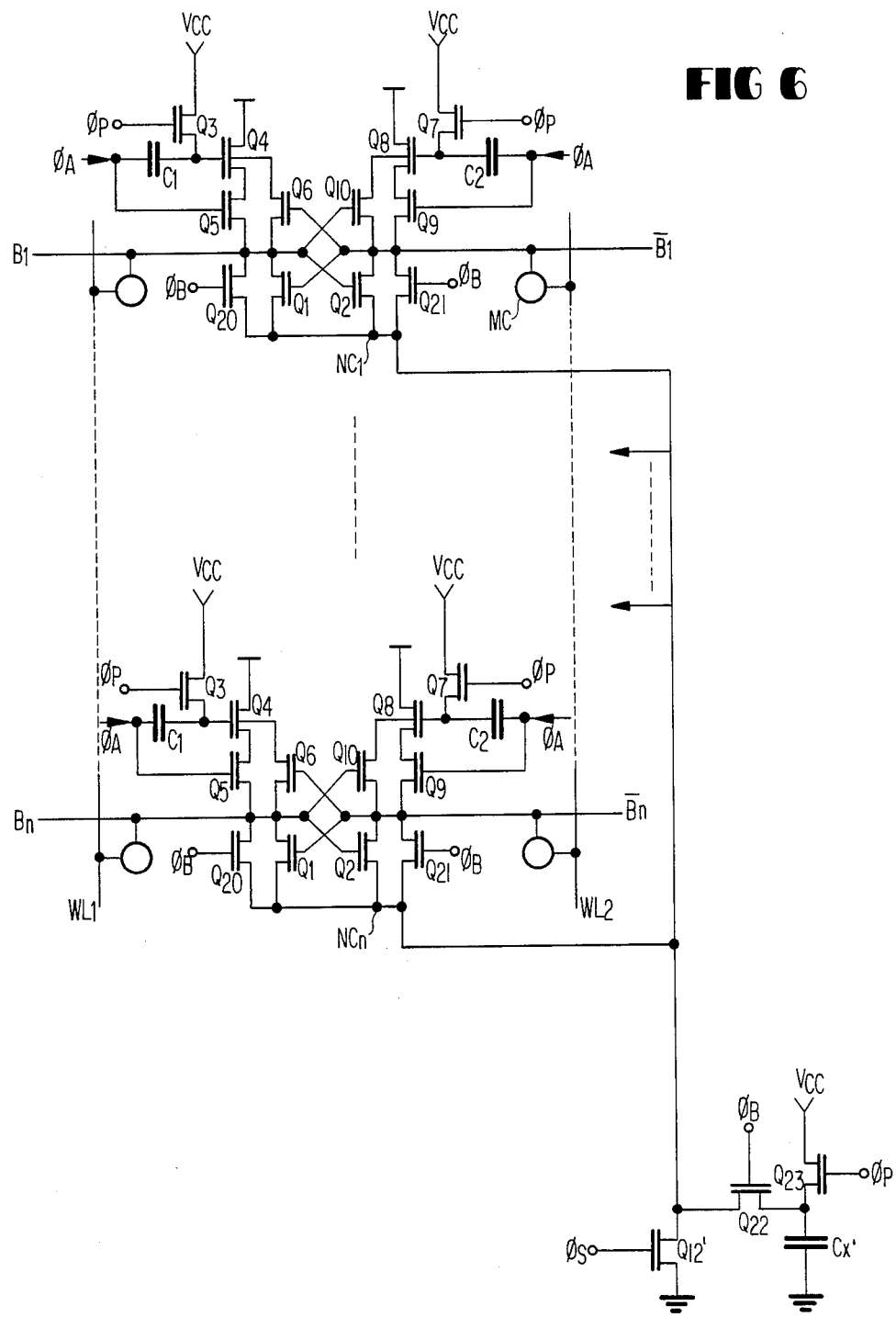
FIG. 6 is a schematic circuit diagram showing a dynamic memory according to a third embodiment of the present invention.

Referring to FIG. 6, a third embodiment of the present invention will be described.

This embodiment is characterized in that the common nodes $NC_1$ to $NC_n$ of a plurality of sense amplifiers for a plurality of pairs of bit lines $B_1$, $\overline{B}$, to $B_n$, $\overline{B}_n$ are connected in common and MOST $Q_{12}'$ for enabling the sense amplifiers in response to $\phi_S$ and MOSTs $Q_2$ and $Q_{23}$ and the capacitor $C_X'$ are connected to the commonly connected nodes $NC_1$ to $NC_n$, as illustrated. In this case, the capacitance of the capacitor $C_X'$ is selected to be "n" times the sum of the capacitance $C_A$ of each capacitor $C_1$, $C_2$ and the capacitance $C_S$ of each node ($NC_1$ to $NC_n$), "n" being the number of the sense amplifiers.

Therefore, for a 256 k-bit dynamic memory, the number "n" of the sense amplifiers is 1024, and the value of $C_X'$ is calculated as follows:

$$C_X' = 1024 \times (C_A + C_S) = 1024 \times (0.05 + 0.1)$$
$$\approx 154 \, pF$$

As has been described above, according to the present invention, a pair of bit lines B and $\overline{B}$ are accurately precharged to $\frac{1}{2} V_{cc}$. Therefore a dynamic memory having a high-sensitivity can be obtained.

I claim:

1. A dynamic memory, comprising; a pair of bit lines, amplifying means having a pair of input/output nodes and at least one internal node having a stray capacitance, means for connecting said pair of bit lines to said pair of input/output nodes, first means for operatively enabling said amplifying means to thereby amplify a difference in potentials on said pair of bit lines, second means for operatively short-circuiting said pair of bit lines via said internal node after said amplifying means is enabled by said first means, capacitor means, third means for charging said capacitor means before said pair of bit lines are short-circuited, and fourth means for transmitting charge accumulated in said capacitor means to said pair of bit lines when said pair of bit lines are short-circuited.

2. The dynamic memory according to claim 1, in which said capacitor means has a capacitance substantially equal to said stray capacitance.

3. The dynamic memory according to claim 1, wherein said amplifying means includes a flip-flop circuit and a pair of pull-up circuits provided for said pair of bit lines.

4. In a dynamic memory of the type having a pair of bit lines, a plurality of memory cells coupled to said pair of bit lines, means for selecting one of said memory cells to thereby cause a voltage difference between said pair of bit lines, a sense amplifier including first and second sense nodes, a common node, a first transistor having a source-drain path connected between said first sense node and said common node and a gate connected to said second node, a second transistor having a source-drain path connected between said second sense node and said common node and a gate connected to said first node, means for connecting one of said pair of bit lines to said first sense node, and means for connecting the other of said pair of bit lines to said second sense node, means for operatively enabling said sense amplifier to thereby enlarge said voltage difference between said pair of bit lines so that one of said pair of bit lines has a first potential and the other has a second potential lower than said first potential, means for operatively short-circuiting said pair of bit lines, a pair of pull-up circuits coupled to said pair of bit lines, each of said pull-up circuits including a first capacitor, one of said pull-up circuits coupled to said one of said pair of bit lines having said first potential for raising a potential of said one bit line to approximately a power supply potential, the first capacitor of the other of said pair of pull-up circuits coupled to the other bit line of said second potential being electrically connected to said other bit line when said sense amplifier is enabled; the improvement comprising a second capacitor, means for operatively charging said second capacitor to raise the potential at one end of said capacitor to said power supply potential before said pair of bit lines are short-circuited, and means for electrically connecting said one end of said second capacitor to said pair of bit lines when said pair of bit lines are short-circuited.

5. The invention as claimed in claim 4, in which said common node has a stray capacitance and a capacitance of said second capacitor is approximately equal to the sum of said stray capacitance of said common node and a capacitance of said first capacitor of said other pull-up circuit.

6. The invention as claimed in claim 4, in which said short-circuiting means includes a third transistor having a source-drain path coupled between one of said pair of bit lines and said common node and a fourth transistor coupled between the other of said pair of bit lines and said common node.

7. A dynamic memory, comprising; a plurality of pairs of bit lines, a plurality of amplifying means provided for said plurality of pairs of bit lines, each of said amplifying means being connected to each pair of bit lines to operatively amplify potentials on said pair of bit lines into first and second voltages and including an internal capacitance, means for simultaneously enabling said plurality of amplifying means, a plurality of first means provided for said plurality of pairs of bit lines, each of said first means operatively short-circuiting each pair of bit lines after potentials on each pair of bit lines are amplified by said amplifying means, said internal capacitance of each of said amplifying means being connected to the associated pair of bit lines when said associated pair of bit lines are short-circuited, capacitor means, second means for operatively charging said capacitor means when said plurality of amplifying means are enabled, and third means for operatively connecting said capacitor means to said internal nodes of said amplifying means when each pair of bit lines are short-circuited.

8. The dynamic memory according to claim 7, in which said capacitor means has a capacitance substantially equal to a sum of said internal capacitances.

9. A dynamic memory, comprising; a pair of bit lines, a sense amplifier including a first field effect transistor having a source-drain path coupled between a first node and a common node and a gate coupled to a second node, a second field effect transistor having a source-drain path coupled between said second node and said common node and a gate coupled to said first node, and a third field effect transistor coupled between said common node and a reference voltage terminal, means for connecting one of said pair of bit lines to said first node, means for connecting the other of said pair of bit lines to said second node, a plurality of memory cells coupled to said pair of bit lines, means for selecting one of said memory cells to thereby cause a voltage difference between said bit lines, means for operatively rendering said third transistor conductive to thereby enable said sense amplifier, a fourth field effect transistor having a source-drain path coupled between said one of said pair of bit lines and said common node, a fifth field effect transistor having a source-drain path coupled between the other of said pair of bit lines and said common node, a capacitor having a first terminal connected to a fixed potential source and a second terminal, a sixth field effect transistor having a source-drain path coupled between said second terminal of said capacitor and said common node, charge means for operatively charging said second terminal of said capacitor to approximately a power supply voltage, means for enabling said charge means when said third transistor is made conductive, means for rendering said fourth and fifth transistors conductive when said third transistor is non-conductive, and means for rendering said sixth transistor conductive when said fourth and fifth transistors are conductive.

10. The dynamic memory according to claim 9, in which a capacitance of said capacitor is approximately equal to a capacitance at said common node.

11. The dynamic memory according to claim 9, further comprising a pair of active pull-up circuits coupled to said pair of bit lines.

12. A dynamic memory, comprising; a pair of bit lines, a sense amplifier including a first field effect transistor having a source-drain path coupled between a first node and a common node and a gate coupled to a second node, a second field effect transistor having a source-drain path coupled between said second node and said common node and a gate coupled to said first node, and a third field effect transistor coupled between said common node and a reference voltage terminal, means for connecting one of said pair of bit lines to said first node, means for connecting the other of said pair of bit lines to said second node, a plurality of memory cells coupled to said pair of bit lines, means for selecting one of said memory cells to thereby cause a voltage difference between said bit lines, means for operatively rendering said third transistor conductive to thereby enable said sense amplifier, a fourth field effect transistor having a source-drain path coupled between said one of said pair of bit lines and a third node, a fifth field effect transistor having a source-drain path coupled between the other of said pair of bit lines and said third node, a capacitor having a first terminal connected to a fixed potential source and a second terminal coupled to said third node, charge means for operatively charging said second terminal of said capacitor to approximately a power supply voltage, means for enabling said charge means when said third transistor is made conductive, and means for rendering said fourth and fifth transistors conductive when said third transistor is non-conductive.

* * * * *